(12) United States Patent
Kusunoki et al.

(10) Patent No.: US 7,808,083 B2
(45) Date of Patent: Oct. 5, 2010

(54) SEMICONDUCTOR DEVICE

(75) Inventors: Junya Kusunoki, Tokyo (JP); Takashi Hirano, Tokyo (JP)

(73) Assignee: Sumitomo Bakelite Company, Ltd., Tokyo (JP)

( * ) Notice: Subject to any disclaimer, the term of this patent is extended or adjusted under 35 U.S.C. 154(b) by 189 days.

(21) Appl. No.: 11/663,924

(22) PCT Filed: Sep. 29, 2005

(86) PCT No.: PCT/JP2005/017931

§ 371 (c)(1),
(2), (4) Date: Mar. 27, 2007

(87) PCT Pub. No.: WO2006/035860

PCT Pub. Date: Apr. 6, 2006

(65) Prior Publication Data

US 2008/0277805 A1    Nov. 13, 2008

(30) Foreign Application Priority Data

Sep. 29, 2004  (JP) ............... 2004-282873

(51) Int. Cl.
*H01L 23/48* (2006.01)
(52) U.S. Cl. ............... 257/633; 257/753; 257/632; 257/E23.019
(58) Field of Classification Search .......... 257/788, 257/632, 633, 790, 795, 753, 758, E23.019, 257/E23.022; 430/270.1; 528/271, 633, 528/788

See application file for complete search history.

(56) References Cited

U.S. PATENT DOCUMENTS

| 4,339,521 A | 7/1982 | Ahne et al. |
| 6,270,900 B1 * | 8/2001 | Wakizaka et al. ............ 428/416 |
| 7,022,790 B2 * | 4/2006 | Elce et al. .................... 526/281 |
| 2002/0136982 A1 * | 9/2002 | Goodall et al. ........... 430/270.1 |
| 2003/0087082 A1 | 5/2003 | Boisvert et al. |
| 2004/0039153 A1 * | 2/2004 | Elce et al. .................... 528/403 |
| 2004/0102601 A1 * | 5/2004 | Saito et al. .................. 528/271 |
| 2006/0008734 A1 * | 1/2006 | Amoroso et al. ......... 430/270.1 |

FOREIGN PATENT DOCUMENTS

| JP | 1-46862 | 10/1989 |
| JP | 7221128 A | 8/1995 |
| JP | 2002-93945 | 3/2002 |
| JP | 2002-121259 | 4/2002 |
| JP | 2004-27005 | 1/2004 |
| WO | 98/59004 | 12/1998 |

OTHER PUBLICATIONS

International Search Report.

* cited by examiner

*Primary Examiner*—Victor A Mandala
*Assistant Examiner*—Scott Stowe
(74) *Attorney, Agent, or Firm*—Smith, Gambrell & Russell, LLP

(57) ABSTRACT

Disclosed is a semiconductor device having a wafer level package structure which is characterized by containing a resin layer composed of a resin composition which is curable at 250° C. or less. Such a semiconductor device having a wafer level package structure is excellent in low stress properties, solvent resistance, low water absorbency, electrical insulation properties, adhesiveness and the like.

4 Claims, 4 Drawing Sheets

SEMICONDUCTOR DEVICE

TECHNICAL FIELD

The present invention relates to a semiconductor device having a wafer level package structure.

BACKGROUND ART

Polyimide resins and polybenzoxazole resins having excellent heat resistance, electrical characteristics and mechanical characteristics or the like have been used for surface protection films and interlayer insulating films of a semiconductor element (Patent Document 1).

However, when a polyimide resin has been used, there exists a problem in that a polyamide acid, which is a precursor before curing, has caused the copper used for wiring to corrode, and as a result, migration has occurred. Also, the polyimide resin has a high cure temperature of about 350° C., and therefore there is a problem that the copper has been oxidized in the cure reaction.

Furthermore, the high integration and multilayering of a semiconductor element which is represented by the semiconductor device having a wafer level package structure has caused large problems such as the delay of signals in the wiring and the increase of power consumption. Since the polyimide resin has a comparatively high dielectric constant of 2.6 to 3.5, materials having a low dielectric constant have been required for the surface protection films and the interlayer insulating films.

In addition, there exists a problem in that both the polyimide resin and the polybenzoxazole resin have had large stress. When these resin layers have been used in the frontier semiconductor, a problem exists in that the semiconductor element has been broken because of the stress of the protective film itself, and the stress from the outside has not been able to be reduced. Thereby, lower stress properties have been required for the protective film.

The resin composition used for the semiconductor device having the wafer level package structure for solving the above problems has not been known until now.

Patent Document 1: Japanese Patent Laid-Open No. 2001-194796

DISCLOSURE OF THE PRESENT INVENTION

Problems to be Solved

It is an object of the present invention to provide a semiconductor device having a wafer level package structure which is excellent in low stress properties, solvent resistance, low water absorbency, electric insulation properties and adhesiveness or the like.

Measures for Solving the Problems

As the result of extensive investigations to solve the above-mentioned problems, the present inventors have completed the present invention.

That is, according to an aspect of the present invention, there is provided a semiconductor device having a wafer level package structure comprising a resin layer composed of a resin composition which is curable at 250° C. or less.

According to another aspect of the present invention, there is provided a semiconductor device having a wafer level package structure comprising a resin layer having an elastic modulus after curing of 0.1 GPa or more but no more than 2.0 GPa.

According to another aspect of the present invention, there is provided a semiconductor device having a wafer level package structure comprising a resin layer having a dielectric constant of 2.6 or less.

According to another aspect of the present invention, there is also provided a semiconductor device having a wafer level package structure comprising a resin layer composed of a resin composition which is curable at 250° C. or less, the resin composition having an elastic modulus after curing of 0.1 GPa or more but no more than 2.0 GPa and having a dielectric constant of 2.6 or less.

According to another aspect of the present invention, there is provided a semiconductor device having a wafer level package structure comprising a resin layer composed of a resin composition containing a cyclic olefin resin (A) having an epoxy group and a photoacid generator (B).

In the semiconductor device of the present invention, the cyclic olefin resin is not particularly limited. However, in an embodiment of the present invention, the cyclic olefin resin may be a polynorbornene resin.

Furthermore, in an aspect of the present invention, the cyclic olefin resin (A) having an epoxy group may contain a repeating unit represented by the formula (1):

[Formula 1]

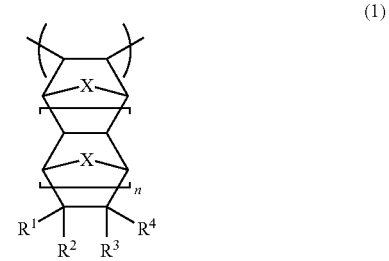

(1)

wherein X is O, $CH_2$ or $(CH_2)_2$; n is an integer of 0 to 5; $R^1$ to $R^4$ are each independently selected from a hydrogen atom, an alkyl group, an alkenyl group, an alkynyl group, an aryl group, an aralkyl group, a functional group containing an ester group, a functional group containing a ketone group, a functional group containing an ether group, and a functional group containing an epoxy group; $R^1$ to $R^4$ may be different in a repetition of a monomer; and at least one of $R^1$ to $R^4$ in all the repeating units is the functional group having an epoxy group.

In another aspect of the present invention, the cyclic olefin resin (A) having an epoxy group may contain repeating units represented by the formulae (2) and (3):

[Formula 2]

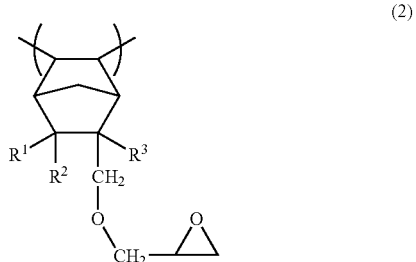

(2)

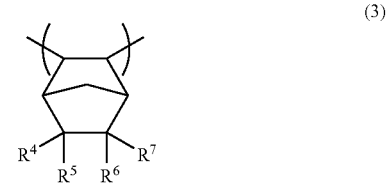

(3)

wherein $R^1$ to $R^7$ are each independently selected from a hydrogen atom, an alkyl group, an alkenyl group, an alkynyl group, an aryl group, an aralkyl group, a functional group containing an ester group, a functional group containing a ketone group, and a functional group containing an ether group; and $R^1$ to $R^7$ may be different in a repetition of a monomer.

Furthermore, in another aspect of the present invention, the cyclic olefin resin (A) having an epoxy group may contain repeating units represented by the formulae (4), (5) and (6):

[Formula 3]

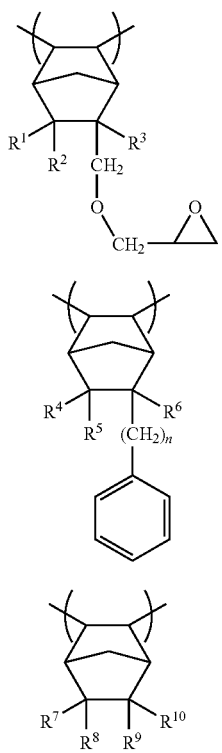

wherein n is an integer of 0 to 5; $R^1$ to $R^{10}$ are each independently selected from a hydrogen atom, an alkyl group, an alkenyl group, an alkynyl group, an aryl group, an aralkyl group, a functional group containing an ester group, a functional group containing a ketone group, and a functional group containing an ether group; and $R^1$ to $R^{10}$ may be different in a repetition of a monomer.

Furthermore, in an aspect of the present invention, the cyclic olefin resin (A) having an epoxy group may contain a repeating unit represented by the formula (7):

[Formula 4]

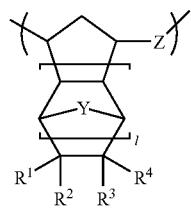

wherein Y is O, $CH_2$ or $(CH_2)_2$; Z is —$CH_2$—$CH_2$— or —CH═CH—; l is an integer of 0 to 5; $R^1$ to $R^4$ are each independently selected from a hydrogen atom, an alkyl group, an alkenyl group, an alkynyl group, an aryl group, an aralkyl group, a functional group containing an ester group, a functional group containing a ketone group, a functional group containing an ether group, and a functional group containing an epoxy group; $R^1$ to $R^4$ may be different in a repetition of a monomer; and at least one of $R^1$ to $R^4$ in all the repeating units has the epoxy group.

EFFECTS OF THE INVENTION

The present invention can provide a semiconductor device having a photosensitive resin composition which is excellent in low stress properties, solvent resistance, low water absorbency, electric insulation properties and adhesiveness or the like.

Figure 1:
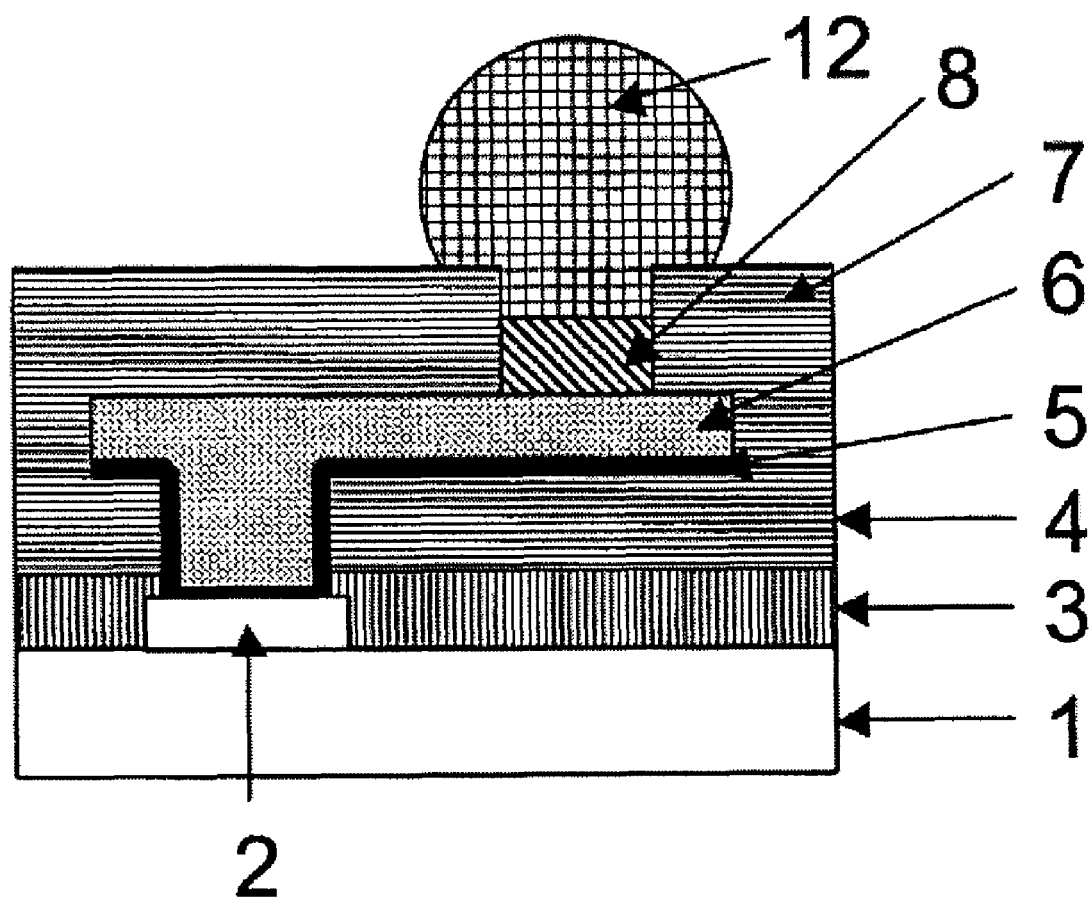
FIG. 1 is a sectional view of a pad portion of an example of a semiconductor device of the present invention.

| Description of Symbols | |
|---|---|
| 1 | silicon wafer |
| 2 | Al pad |
| 3 | passivation film |
| 4 | buffer coat film |
| 5 | metal (e.g. Cr or Ti) film |
| 6 | wiring (e.g. Al or Cu) |
| 7 | insulating film |
| 8 | barrier metal |
| 9 | resist |
| 10 | solder |
| 11 | flux |
| 12 | solder bump |

BEST MODE FOR CARRYING OUT THE INVENTION

General examples of cyclic olefin monomers used in the present invention include monocyclic compounds such as cyclohexene and cyclooctene, and polycyclic compounds such as norbornene, norbornadiene, dicyclopentadiene, dihydrodicyclopentadiene, tetracyclododecene, tricyclopentadiene, dihydrotricyclopentadiene, tetracyclopentadiene and dihydrotetracyclopentadiene. Substituted compounds prepared by bonding functional groups to these monomers can be also used.

Examples of the cyclic olefin resins used in the present invention include polymers of the above cyclic olefin monomers. As the polymerization method, there are used known methods such as random polymerization and block polymerization. Specific examples include (co)polymers of norbornene type monomers, copolymers of the norbornene type monomers and other monomers capable of being copolymerized such as α-olefins, and hydrogen added compounds of these copolymers. These cyclic olefin resins can be produced by the known polymerization methods, and the examples of the polymerization methods include an addition polymerization method and a ring-opening polymerization method. Of these, polymers prepared by addition-(co)polymerizing the norbornene monomers are preferable. However, the present invention is not limited thereto in any way.

Examples of the addition polymers of the cyclic olefin resin include polynorbornene resins. Specific examples thereof include (1) addition (co)polymers of norbornene type monomers prepared by addition-(co)polymerizing the norbornene type monomers, (2) addition copolymers of the norbornene type monomers and ethylene or α-olefins, and (3) addition copolymers of the norbornene type monomer, nonconjugated diene and, as necessary, other monomers. These resins can be prepared by all the known polymerization methods.

Examples of the ring-opening polymers of the cyclic olefin resin include polynorbornene resins. Specific examples thereof include (4) ring-opening (co)polymers of the norbornene type monomer and resins prepared by hydrogenating the (co)polymer as necessary; (5) ring-opening copolymers of the norbornene type monomer and ethylene or α-olefins, and resins prepared by hydrogenating the (co)polymer as necessary; and (6) ring-opening copolymers of the norbornene type monomer and nonconjugated diene or other monomers, and resins prepared by hydrogenating the (co) polymer as necessary. These resins can be prepared by all the known polymerization methods.

Of these, (1) the addition (co)polymers prepared by addition-(co)polymerizing the norbornene type monomers are preferable. However, the present invention is not limited thereto in any way.

As the cyclic olefin monomer used for producing the cyclic olefin resin having an epoxy group used in the present invention, the norbornene type monomer represented by the general formula (8) is preferable.

Specific examples of the alkyl groups include methyl, ethyl, propyl, isopropyl, butyl, pentyl, hexyl, heptyl, octyl, nonyl, desyl, dodecyl, cyclopentyl, cyclohexyl and cyclooctyl groups. Examples of the alkenyl groups include vinyl, allyl, butynyl and cyclohexyl groups. Examples of the alkynyl groups include ethynyl, 1-propynyl, 2-propynyl, 1-butynyl and 2-butynyl groups. Examples of the aryl groups include phenyl, naphthyl and anthracenyl groups. Examples of the aralkyl groups include benzyl and phenethyl groups. However, the present invention is not limited thereto in any way.

Referring to the functional group containing the ester group, the functional group containing the ketone group and the functional group containing the ether group, as long as the functional groups have these groups, the structure thereof is not particularly limited. Preferable examples of the functional groups containing the epoxy group include a functional group having a glycidyl ether group. However, as long as the functional group has the epoxy group, the structure thereof is not particularly limited.

The cyclic olefin monomer used for producing the cyclic olefin resin used in the present invention is not particularly limited. However, for example, there can be used a monomer represented by the formula (8):

[Formula 5]

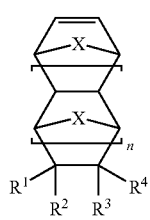

(8)

wherein X is O, $CH_2$ or $(CH_2)_2$; n is an integer of 0 to 5; $R^1$ to $R^4$ are each independently selected from a hydrogen atom, an alkyl group, an alkenyl group, an alkynyl group, an aryl group, an aralkyl group, a functional group containing an ester group, a functional group containing a ketone group, a functional group containing an ether group, and a functional group containing an epoxy group. Here, $R^1$ to $R^4$ may be different in each monomer to be used, and at least one of $R^1$ to $R^4$ in all the monomers to be used is a functional group having an epoxy group.

Examples of the cyclic olefin monomers used for producing the cyclic olefin resin used in the present invention include 5-methyl-2-norbornene, 5-ethyl-2-norbornene, 5-propyl-2-norbornene, 5-butyl-2-norbornene, 5-pentyl-2-norbornene, 5-hexyl-2-norbornene, 5-heptyl-2-norbornene, 5-octyl-2-norbornene, 5-nonyl-2-norbornene and 5-decyl-2-norbornene as the monomer having an alkyl group; 5-allyl-2-norbornene, 5-methylidene-2-norbornene, 5-ethylidene-2-norbornene, 5-isopropylidene-2-norbornene, 5-(2-propenyl)-2-norbornene, 5-(3-butenyl)-2-norbornene, 5-(1-methyl-2-propenyl)-2-norbornene, 5-(4-pentenyl)-2-norbornene, 5-(1-methyl-3-butenyl)-2-norbornene, 5-(5-hexenyl)-2-norbornene, 5-(1-methyl-4-pentenyl)-2-norbornene, 5-(2,3-dimethyl-3-butenyl)-2-norbornene, 5-(2-ethyl-3-butenyl)-2-norbornene, 5-(3,4-dimethyl-4-pentenyl)-2-norbornene, 5-(7-octenyl)-2-norbornene, 5-(2-methyl-6-heptenyl)-2-norbornene, 5-(1,2-dimethyl-5-hexenyl)-2-norbornene, 5-(5-ethyl-5-hexenyl)-2-norbornene, and 5-(1,2,3-trimethyl-4-pentenyl)-2-norbornene 5-allyl-2-norbornene, 5-methylidene-2-norbornene, 5-ethylidene-2-norbornene, 5-isopropylidene-2-norbornene, 5-(2-propenyl)-2-norbornene, 5-(3-butenyl)-2-norbornene, 5-(1-methyl-2-propenyl)-2-norbornene, 5-(4-pentenyl)-2-norbornene, 5-(1-methyl-3-butenyl)-2-norbornene, 5-(5-hexenyl)-2-norbornene, 5-(1-methyl-4-pentenyl)-2-norbornene, 5-(2,3-dimethyl-3-butenyl)-2-norbornene, 5-(2-ethyl-3-butenyl)-2-norbornene, 5-(3,4-dimethyl-4-pentenyl)-2-norbornene, 5-(7-octenyl)-2-norbornene, 5-(2-methyl-6-heptenyl)-2-norbornene, 5-(1,2-dimethyl-5-hexenyl)-2-norbornene, 5-(5-ethyl-5-hexenyl)-2-norbornene, and 5-(1,2,3-trimethyl-4-pentenyl)-2-norbornene as the monomer having an alkenyl group; 5-ethynyl-2-norbornene as the monomer having an alkynyl group; 1,1,3,3,5,5-hexamethyl-1,5-dimethylbis(2-(5-norbornene-2-yl)ethyl)trisiloxane as the monomer having a silyl group; 5-phenyl-2-norbornene, 5-naphthyl-2-norbornene, 5-pentafluorophenyl-2-norbornene as the monomer having an aryl group; 5-benzyl-2-norbornene, 5-phenethyl-2-norbornene, 5-pentafluorophenylmethyl-2-norbornene, 5-(2-pentafluorophenylethyl)-2-norbornene, 5-(3-pentafluorophenylpropyl)-2-norbornene as the monomer having an aralkyl group; dimethylbis((5-norbornene-2-yl)methoxy)silane, 5-trimethoxysilyl-2-norbornene, 5-triethoxysilyl-2-norbornene, 5-(2-trimethoxysilylethyl)-2-norbornene, 5-(2-triethoxysilylethyl)-2-norbornene, 5-(3-trimethoxysilylpropyl)-2-norbornene, 5-(4-trimethoxybutyl)-2-norbornene, and 5-trimethylsilylmethylether-2-norbornene as the monomer having an alkoxysilyl group; 5-norbornene-2-methanol and its alkyl ether, 5-norbornene-2-methyl acetate, 5-norbornene-2-methyl propionate, 5-norbornene-2-methyl butyrate, 5-norbornene-2-methyl valerate, 5-norbornene-2-methyl caproate, 5-norbornene-2-methyl caprylate, 5-norbornene-2-methyl caprate, 5-norbornene-2-methyl laurate, 5-norbornene-2-methyl stearate, 5-norbornene-2-methyl oleate, 5-norbornene-2-methyl linolenate, 5-norbornene-2-carboxylic acid, methyl 5-norbornene-2-carboxylate, ethyl 5-norbornene-2-carboxylate, t-butyl 5-norbornene-2-carboxylate, i-butyl 5-norbornene-2-carboxylate, trimethylsilyl 5-norbornene-2-carboxylate, triethylsilyl 5-norbornene-2-carboxylate, isobornyl 5-norbornene-2-carboxylate, 2-hydroxyethyl 5-norbornene-2-carboxylate, methyl 5-norbornene-2-methyl-2-carboxylate, 5-norbornene-2-methyl cinnamate, 5-norbornene-2-methyl ethyl carbonate, 5-norbornene-2- methyl n-butyl carbonate, 5-norbornene-2-methyl t-butyl carbonate, 5-methoxy-2-norbornene, 5-norbornene-2-methyl (meth)acrylate, 5-norbornene-2-ethyl (meth)acrylate, 5-norbornene-2-n-butyl (meth)acrylate, 5-norbornene-2-n-propyl (meth)acrylate, 5-norbornene-2-i-butyl (meth)acrylate, 5-norbornene-2-i-propyl (meth)acrylate, 5-norbornene-2-hexyl (meth)acrylate, 5-norbornene-2-octyl (meth)acrylate, and 5-norbornene-2-decyl (meth)acrylate as the monomer having a hydroxyl group, an ether group, a carboxyl group, an ester group, an acrylyl group or a methacryloyl group; 5-[(2,3-epoxypropoxy)methyl]-2-norbornene as the monomer having an epoxy group; 8-methoxycarbonyltetracyclo[4.4.0.1$^{2,5}$.1$^{7,10}$]dodec-3-ene, 8-ethoxycarbonyltetracyclo[4.4.0.1$^{2,5}$.1$^{7,10}$]dodec-3-ene, 8-n-propylcarbonyltetracyclo[4.4.0.1$^{2,5}$.1$^{7,10}$]dodec-3-ene, 8-i-propylcarbonyltetracyclo[4.4.0.1$^{2,5}$.1$^{7,10}$]dodec-3-ene, 8-n-butoxycarbonyltetracyclo[4.4.0.1$^{2,5}$.1$^{7,10}$]dodec-3-ene, 8-(2-methylpropoxy)carbonyltetracyclo[4.4.0.1$^{2,5}$.1$^{7,10}$]dodec-3-ene, 8-(1-methylpropoxy)carbonyltetracyclo[4.4.0.1$^{2,5}$.1$^{7,10}$]dodec-3-ene, 8-t-butoxycarbonyltetracyclo[4.4.0.1$^{2,5}$.1$^{7,10}$]dodec-3-ene, 8-cyclohexyloxycarbonyltetracyclo[4.4.0.1$^{2,5}$.1$^{7,10}$]dodec-3-ene, 8-(4-t-butylcyclohexyloxy)carbonyltetracyclo[4.4.0.1$^{2,5}$.1$^{7,10}$]dodec-3-ene, 8-phenoxycarbonyltetracyclo[4.4.0.1$^{2,5}$.1$^{7,10}$]dodec-3-ene, 8-tetrahydrofuranyloxycarbonyltetracyclo[4.4.0.1$^{2,5}$.1$^{7,10}$]-3-dodecene, 8-tetrahydropyranyloxycarbonyltetracyclo[4.4.0.1$^{2,5}$.1$^{7,10}$]dodec-3-ene, 8-methyl-8-methoxycarbonyltetracyclo[4.4.0.1$^{2,5}$.1$^{7,10}$]dodec-3-ene, 8-methyl-8-ethoxycarbonyltetracyclo[4.4.0.1$^{2,5}$.1$^{7,10}$]dodec-3-ene, 8-methyl-8-n-propoxycarbonyltetracyclo[4.4.0.1$^{2,5}$.1$^{7,10}$]dodec-3-ene, 8-methyl-8-i-propoxycarbonyltetracyclo[4.4.0.1$^{2,5}$.1$^{7,10}$]dodec-3-ene, 8-methyl-8-n-butoxycarbonyltetracyclo[4.4.0.1$^{2,5}$.1$^{7,10}$]dodec-3-ene, 8-methyl-8-(2-methylpropoxy)carbonyltetracyclo[4.4.0.1$^{2,5}$.1$^{7,10}$]dodec-3-ene, 8-methyl-8-(1-methylpropoxy)carbonyltetracyclo[4.4.0.1$^{2,5}$.1$^{7,10}$]dodec-3-ene, 8-methyl-8-t-butoxycarbonyltetracyclo[4.4.0.1$^{2,5}$.1$^{7,10}$]dodec-3-ene, 8-methyl-8-cyclohexyloxycarbonyltetracyclo[4.4.0.1$^{2,5}$.1$^{7,10}$]dodec-3-ene, 8-methyl-8-(4'-t-butylcyclohexyloxy)carbonyltetracyclo[4.4.0.1$^{2,5}$.1$^{7,10}$]dodec-3-ene, 8-methyl-8-phenoxycarbonyltetracyclo[4.4.0.1$^{2,5}$.1$^{7,10}$]dodec-3-ene, 8-methyl-8-tetrahydrofuranyloxycarbonyltetracyclo[4.4.0.1$^{2,5}$.1$^{7,10}$]dodec-3-ene, 8-methyl-8-tetrahydropyranyloxycarbonyltetracyclo[4.4.0.1$^{2,5}$.1$^{7,10}$]-3-dodecene, 8-methyl-8-acetoxytetracyclo[4.4.0.1$^{2,5}$.1$^{7,10}$]dodec-3-ene, 8,9-di(methoxycarbonyl)tetracyclo[4.4.0.1$^{2,5}$.1$^{7,10}$]dodec-3-ene, 8,9-di(ethoxycarbonyl)tetracyclo[4.4.0.1$^{2,5}$.1$^{7,10}$]dodec-3-ene, 8,9-di(n-propoxycarbonyl)tetracyclo[4.4.0.1$^{2,5}$.1$^{7,10}$]dodec-3-ene, 8,9-di(i-propoxycarbonyl)tetracyclo[4.4.0.1$^{2,5}$.1$^{7,10}$]dodec-3-ene, 8,9-di(n-butoxycarbonyl)tetracyclo[4.4.0.1$^{2,5}$.1$^{7,10}$]dodec-3-ene, 8,9-di(t-butoxycarbonyl)tetracyclo[4.4.0.1$^{2,5}$.1$^{7,10}$]dodec-3-ene, 8,9-di(cyclohexyloxycarbonyl)tetracyclo[4.4.0.1$^{2,5}$.1$^{7,10}$]dodec-3-ene, 8,9-di(phenoxyloxycarbonyl)tetracyclo[4.4.0.1$^{2,5}$.1$^{7,10}$]dodec-3-ene, 8,9-di(tetrahydrofuranyloxycarbonyl)tetracyclo[4.4.0.1$^{2,5}$.1$^{7,10}$]-3-dodecene, 8,9-di(tetrahydropyranyloxycarbonyl)tetracyclo[4.4.0.1$^{2,5}$.1$^{7,10}$]-3-dodecene, 8,9-tetracyclo[4.4.0.1$^{2,5}$.1$^{7,10}$]dodec-3-ene, tetracyclo[4.4.0.1$^{2,5}$.1$^{7,10}$]dodec-3-ene-8-carboxylic acid, 8-methyltetracyclo[4.4.0.1$^{2,5}$.1$^{7,10}$]dodec-3-ene-8-carboxylic acid, 8-methyltetracyclo[4.4.0.1$^{2,5}$.1$^{7,10}$]dodec-3-ene, 8-ethyltetracyclo[4.4.0.1$^{2,5}$.1$^{7,10}$]dodec-3-ene, 8-methyltetracyclo[4.4.0.1$^{2,5}$.0$^{1,6}$]dodec-3-ene, 8-ethylidenetetracyclo[4.4.0.1$^{2,5}$.1$^{7,12}$]dodec-3-ene, and 8-ethylidenetetracyclo[4.4.0.1$^{2,5}$.1$^{7,10}$0$^{1,6}$]dodec-3-ene as the monomer containing a tetracyclo ring.

Preferably, the cyclic olefin resin (A) having an epoxy group used in the present invention is an addition (co) poly mer of a norbornene type monomer represented by the general formula (9),

[Formula 6]

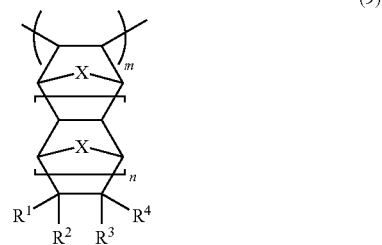

(9)

wherein X is O, CH$_2$ or (CH$_2$)$_2$; n is an integer of 0 to 5; m is an integer of 10 to 10,000; R$^1$ to R$^4$ are specifically selected from a hydrogen atom, an alkyl group, an alkenyl group, an alkynyl group, an aryl group, an aralkyl group, a functional group containing an ester group, a functional group containing a ketone group, a functional group containing an ether group, and a functional group containing an epoxy group; R$^1$ to R$^4$ may be different in a repetition of a monomer; and at least one of R$^1$ to R$^4$ in all the repeating units is the functional group having an epoxy group.

As the cyclic olefin resin (A) having an epoxy group used in the present invention, polymers represented by the formulae (10) and (11):

[Formula 7]

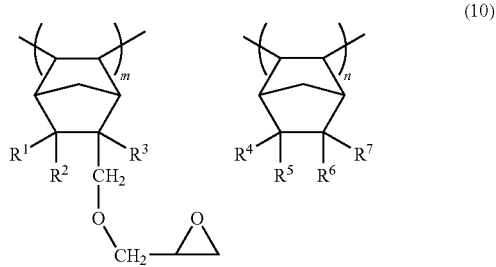

(10)

are preferable in view of the polymer characteristic after curing, wherein m and n are an integer of 1 or more; R$^1$ to R$^7$ are each independently selected from a hydrogen atom, an alkyl group, an alkenyl group, an alkynyl group, an aryl group, an aralkyl group, a functional group containing an ester group, a functional group containing a ketone group, and a functional group containing an ether group; and R$^1$ to R$^7$ may be different in a repetition of a monomer,

[Formula 8]

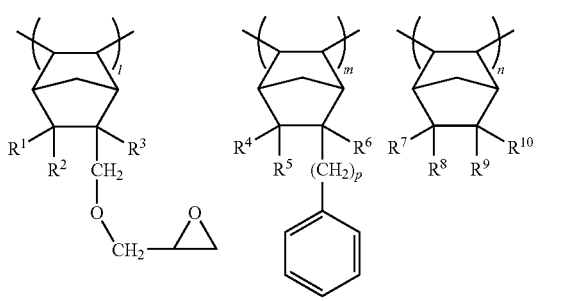

(11)

wherein l, m and n are an integer of 1 or more; p is an integer of 0 to 5; R$^1$ to R$^{10}$ are each independently selected from a hydrogen atom, an alkyl group, an alkenyl group, an alkynyl group, an aryl group, an aralkyl group, a functional group containing an ester group, a functional group containing a ketone group, and a functional group containing an ether group; and $R^1$ to $R^{10}$ may be different in a repetition of a monomer. As shown in the formula (11), the solubility to polar solvents such as cyclopentanone and heptanone used as a solvent for a negative type developing solution can be enhanced by introducing the norbornene monomer having an aralkyl group into the polymer, and the introduction has such an advantage that the polymer has excellent operability.

As the cyclic olefin resin (A) having an epoxy group used in the present invention, a polymer represented by the formula (12):

[Formula 9]

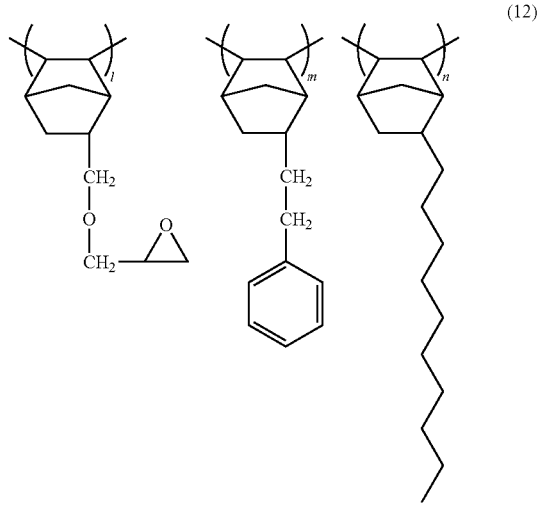

(12)

more desirable in view of the polymer characteristic after curing, wherein l, m and n are an integer of 1 or more. A film having low elastic modulus is obtained by introducing a monomer having a desyl group. Also, a film excellent in low water absorbency, chemical resistance and polar solvent solubility is obtained by introducing a monomer having a phenylethyl group.

The content of the monomer having an epoxy group in the copolymer can be determined based on whether the copolymer is crosslinked by exposure and a crosslink density capable of enduring the developing solution is obtained. The monomer having an epoxy group can be used at a ratio of 5 to 95 mol %, preferably 20 to 80 mol %, and more preferably 30 to 70% in the polymer. The polymer thus obtained exhibits excellent physical characteristics such as low water absorbency (<0.3 wt %), low dielectric constant (<2.6), low dielectric loss (0.001), and glass transition point (170 to 400° C.).

Although the cyclic olefin resin (A) having an epoxy group used in the present invention can be generally prepared by directly polymerizing monomers containing the epoxy group in a molecule, the same polymer can be also prepared by a method for introducing an epoxy group into a side chain by a modification reaction after the polymerization. Examples of the modification reactions include known methods such as a method for subjecting a unsaturated monomer containing an epoxy group to graft reaction with the above polymer, a method for reacting a reactive functional moiety of the above polymer with a compound having an epoxy group, and a method for directly epoxidizing the above polymer having a carbon-carbon double bond in a molecule using an epoxidizing agent such as peracid and hydroperoxide.

The addition polymer of the cyclic olefin resin is prepared by coordination polymerization or radical polymerization due to a metal catalyst. Of these, in the coordination polymerization, a polymer is prepared by polymerizing monomers in a solution in the presence of a transition metal catalyst (NiCOLE R. GROVE et al. Journal of Polymer Science: part B, Polymer Physics, Vol. 37, 3003 to 3010 (1999)).

Typical nickel and platinum catalysts as the metal catalysts used for the coordination polymerization are disclosed in PCT WO 97/33198 and PCT WO 00/20472. Examples of the metal catalysts for coordination polymerization include known metal catalysts such as
(toluene)bis(perfluorophenyl)nickel,
(methylene)bis(perfluorophenyl)nickel,
(benzene)bis(perfluorophenyl)nickel,
bis(tetrahydro)bis(perfluorophenyl)nickel,
bis(ethylacetate)bis(perfluorophenyl)nickel, and
bis(dioxane)bis(perfluorophenyl)nickel.

Radical polymerization techniques are disclosed in Encyclopedia of Polymer Science, John Wiley & Sons, 13, 708 (1988).

In the radical polymerization, monomers are generally reacted in a solution by raising the temperature of the solution to 50° C. to 150° C. in the presence of a radical initiator. Examples of the radical initiators include azobis(isobutyronitrile) (AIBN), benzoyl peroxide, lauryl peroxide, azobiskaptro nitrile, azobis isolero nitrile and t-butyl hydrogen peroxide.

The ring-opening polymer of the cyclic olefin resin is prepared by ring-opening (co)polymerizing at least one kind of norbornene type monomer using titanium and tungsten compounds as a catalyst by known ring-opening polymerization methods to produce a ring-opening (co)polymer, by hydrogenating the carbon-carbon double bond in the ring-opening (co)polymer by a usual hydrogenating method as necessary to produce a thermoplastic saturated norbornene resin.

Suitable polymerization solvents for the above polymerization system include hydrocarbon solvents and aromatic solvents. Examples of the hydrocarbon solvents include, but are not limited to, pentane, hexane, heptane and cyclohexane. Examples of the aromatic solvents, but are not limited to, benzene, toluene, xylene and mesitylene. Diethyl ether, tetrahydrofuran, ethyl acetate, ester, lactone, ketone and amide can be also used. These solvents may be used singly or in admixture as the polymerization solvent.

The molecular weight of the cyclic olefin resin of the present invention can be controlled by changing a ratio of an initiator and monomer or changing polymerization time. When the above metal catalyst for coordination polymerization is used, the molecular weight can be controlled by using a chain transfer catalyst as disclosed in U.S. Pat. No. 6,136, 499. In the present invention, α-olefins such as ethylene, propylene, 1-hexane, 1-decene and 4-methyl-1-pentene are suitable for controlling the molecular weight.

In the present invention, the weight average molecular weight is 10,000 to 500,000, preferably 30,000 to 100,000, and more preferably 50,000 to 80,000. The weight average molecular weight can be measured by gel permeation chromatography (GPC) using polynorbornene as a standard (in reference to ASTMDS3536-91).

All known compounds as a photoacid generator can be used. The photoacid generator crosslinks the epoxy group and increases adhesiveness to a substrate according to the subsequent curing. Preferable examples of the photoacid generators include onium salts, halogen compounds, sulfonates and the mixture thereof. Examples of the onium salts include diazonium salts, ammonium salts, iodonium salts, sulfonium salts, phosphonium salts, arsonium salts and oxonium salts. As long as a compound can produce counter anions with the above onium salts, the counter anions are not limited. Examples of the counter anions include, but are not limited to, boric acid, arsonium acid, phosphoric acid, antimonic acid, sulfonate, carboxylic acid and chloride thereof. As the photoacid generator of the onium salts, triphenylsulfonium tetrafluoroborate, triphenylsulfonium tetrafluoroborate, triphenylsulfonium tetrafluoroarsenate, triphenylsulfonium tetrafluorophosphate, triphenylsulfonium pentafluorosulfate, 4-thiophenoxydiphenylsulfonium tetrafluoroborate, 4-thiophenoxydiphenylsulfonium hexafluoroantimonate, 4-thiophenoxydiphenylsulfonium hexafluoroarsenate, 4-thiophenoxydiphenylsulfonium tetrafluorophosphate, 4-thiophenoxydiphenylsulfonium trifluorosulfonate, 4-t-butylphenyldiphenylsulfonium tetrafluoroborate, 4-t-butylphenyldiphenylsulfonium hexafluoroarsenate, 4-t-butylphenyldiphenylsulfonium hexafluoroantimonate, 4-t-butylphenyldiphenylsulfonium hexafluorophosphonate, 4-t-butylphenyldiphenylsulfonium trifluorosulfonate, tris(4-methylphenyl)sulfonium tetrafluoroborate, tris(4-methylphenyl)sulfonium tetrafluoroborate, tris(4-methylphenyl)sulfonium hexafluoroarsenate, tris(4-methylphenyl)sulfonium hexafluorophosphate, tris(4-methylphenyl)sulfonium hexafluorosulfonate, tris(4-methoxyphenyl)sulfonium tetrafluoroborate, tris(4-methylphenyl)sulfonium hexafluoroantimonate, tris(4-methylphenyl)sulfonium hexafluorophosphonate, tris(4-methylphenyl)sulfonium trifluorosulfonate, triphenyliodonium tetrafluoroborate, triphenyliodonium hexafluoroantimonate, triphenyliodonium hexafluoroarsenate, triphenyliodonium hexafluorophosphonate, triphenyliodonium trifluorosulfonate, 3,3-dinitrodiphenyliodonium tetrafluoroborate, 3,3-dinitrodiphenyliodonium hexafluoroantimonate, 3,3-dinitrodiphenyliodonium hexafluoroarsenate, 3,3-dinitrodiphenyliodonium trifluorosulfonate, 4,4-dinitrodiphenyliodonium tetrafluoroborate, 4,4-dinitrodiphenyliodonium hexafluoroantimonate, 4,4-dinitrodiphenyliodonium hexafluoroarsenate, and 4,4-dinitrodiphenyliodonium trifluorosulfonate may be used singly or in admixture.

Examples of the photoacid generators containing halogen other than fluoride include 2,4,6-tris(trichloromethyl)triazine, 2-allyl-4,6-bis(trichloromethyl)triazine, α,β,α-tribromomethylphenylsulfone, α,α, 2,3,5,6-hexachloroxylene, 2,2-bis(3,5-dibromo-4-hydroxyphenyl)-1,1,1,3,3,3-hexafluoroxylene, 1,1,1-tris(3,5-dibromo-4-hydroxyphenyl)ethane, and the mixture thereof.

Examples of sulfonate photoacid generators include, but are not limited to, 2-nitrobenzyl tosylate, 2,6-dinitrobenzyl tosylate, 2,4-dinitrobenzyl tosylate, 2-nitrobenzenemethyl sulfonate, 2-nitrobenzyl acetate, 9,10-dimethoxy anthracene-2-sulfonate, 1,2,3-tris(methane sulfonyloxy)benzene, 1,2,3-tris(ethane sulfonyloxy)benzene, and 1,2,3-tris(propane sulfonyloxy)benzene.

Preferable examples of the photoacid generators include 4,4'-di-t-butylphenyl iodonium triflate, 4,4',4"-tris(t-butylphenyl)sulphonium triflate; diphenyliodonium tetrakis (pentafluorophenyl)borate; triphenylsulfoniumdiphenyliodonium tetrakis(pentafluorophenyl)borate; 4,4'-di-t-butylphenyliodonium tetrakis(pentafluorophenyl)borate; tris (t-butylphenyl)sulphonium tetrakis(pentafluorophenyl) borate, (4-methylphenyl-4-(1-methylethyl)phenyliodonium tetrakis(pentafluorophenyl)borate, and the mixture thereof.

The mixed proportion of the photoacid generator in the present invention is 0.1 to 100 parts by weight relative to 100 parts by weight of the cyclic olefin resin, and more preferably 0.1 to 10 parts by weight.

A sensitizer can be used for the cyclic olefin resin composition of the present invention for higher photosensitivity as necessary. The sensitizer can extend a wavelength range capable of activating the photoacid generator, and can be added in a range which has no direct influence on the cross-linking reaction of the polymer. The optimal sensitizer has the maximum light absorption coefficient near the used light source and can pass the absorbed energy to the photoacid generator efficiently. Examples of the sensitizers for the photoacid generator include polycyclic aromatic compounds such as anthracene, pyrene and parylene. Examples thereof include 2-isopropyl-9H-thioxanthen-9-ene, 4-isopropyl-9H-thioxanthen-9-one, 1-chloro-4-propoxythioxanthene, phenothiazine, and the mixture thereof. The mixed proportion of the photoacid generator in the present invention is 0.1 to 10 parts by weight relative to 100 parts by weight of the polymer, and more preferably 0.2 to 5 parts by weight. When the light source has a long wavelength such as a g line (436 nm) and an i line (365 nm), the sensitizer is effective for activating the photoacid generator.

The resolution can be enhanced by adding small quantity of acid scavenger as necessary into the cyclic olefin resin composition of the present invention. The acid scavenger absorbs acids diffused to a non light-exposed portion during the photochemical reaction. Examples of the acid scavengers include, but are not limited to, a second and third amines such as pyridine, lutidine, phenothiazine, tri-n-propyl amine and triethyl amine. The mixed proportion of the acid scavenger is 0.10 to 0.05 parts by weight relative to 100 parts by weight of the polymer.

In the present invention, additive agents, such as a leveling agent, an antioxidant, a fire retardant, a plasticizer, a silane coupling agent and a filler can be added as necessary into the resin composition containing the cyclic olefin resin (A) having an epoxy group and the photoacid generator (B).

In the present invention, these components are dissolved in a solvent and used in a varnish state. Examples of the solvents include non-reactive and reactive solvents. The non-reactive solvent acts as the career of the polymer or additive, and is removed in the processes of the coating and curing. The reactive solvent contains a reactive group having a compatibility with the curing agent added into the resin composition. Examples of non-reactive solvents include hydrocarbon solvents and aromatic solvents. Examples of the hydrocarbon solvents include, but are not limited to, alkane and cycloalkane such as pentane, hexane, heptane, cyclohexane and decahydronaphthalene. Examples of the aromatic solvents include benzene, toluene, xylene and mesitylene. Diethyl ether, tetrahydrofuran, anisole, acetate, ester, lactone, ketone and amide are also useful. As the reactive solvents, cyclo ether compounds such as cyclohexene oxide and α-pinene oxide, aromatic cycloethers such as [methylenebis(4,1-phenyleneoxymethylene)]bis oxirane, alicyclic vinyl ether compounds such as 1,4-cyclohexanedimethanoldivinyl ether, and aromatic compounds such as bis(4-vinylphenyl)methane may be used singly or in admixture. The reactive solvent is preferably mesitylene and decahydronaphthalene. They are optimal for coating resins on substrates made of silicon, silicon oxide, silicon nitride and silicon oxynitride or the like.

The resin solid content of the resin composition used for the present invention is 5 to 60% by weight. The resin solid content is more preferably 30 to 55% by weight, and still more preferably 35 to 45% by weight. The viscosity of the solution is 10 to 25,000 cP, and preferably 100 to 3,000 cP.

The resin composition used for the present invention is prepared by simply mixing the cyclic norbornene resin having an epoxy group, the photoacid generator, and as necessary, the solvent, the sensitizer, the acid scavenger, the leveling agent, the antioxidant, the fire retardant, the plasticizer, the silane coupling agent and the filler or the like.

The cure temperature of the resin composition used for the present invention is preferably 250° C. or less, and more preferably 210° C. or less. Since the cure temperature exceeding 250° C. causes the simultaneous oxidization of copper wiring in curing, there exists a problem in that the resistance value is increased.

When the elastic modulus after curing of the resin composition used for the present invention exceeds 2.0 GPa, the stress of the resin itself causes the occurrence of cracks in a chip or reduces the curing for easing external stress. The elastic modulus of less than 0.1 GPa may cause the occurrence of cracks in metal when a metal layer is formed on an insulating layer. The elastic modulus is preferably 0.4 GPa to 1.0 GPa.

When the dielectric constant after curing of the resin composition used for the present invention is 2.6 or more, a problem exists in that signal delay is caused. The dielectric constant is preferably 2.6 or less, and more preferably 2.50 or less.

A method for using the cyclic olefin resin composition used for the present invention will be explained. First, the resin composition is coated on an appropriate substrate, for example, a silicon wafer, a ceramic substrate and an aluminum substrate or the like. As the method for coating, there are spin coating using a spinner, spray coating using a spray coater, immersion, printing, and roll coating or the like. Then, prebaking is conducted at 90 to 140° C. for about 1 to 30 minutes to dry the coating film, after which an actinic ray is applied in a desired pattern. As the actinic ray, there can be used an X-ray, an electron beam, an ultraviolet light and a visible light or the like. However, an actinic ray having a wavelength of 200 to 700 nm is preferable.

Baking is conducted after the irradiation of the actinic ray. This step increases the reaction velocity of epoxy cross-linkage. The baking conditions are set to 50 to 200° C. for about 5 to 60 minutes. The baking conditions are preferably set to 100 to 150° C. for about 10 to 40 minutes, and more preferably 110 to 130° C. for about 15 to 30 minutes.

Then, the non-actinic ray-applied portion is dissolved and removed with a developing solution to obtain a relief pattern. Examples of the developing solutions include hydrocarbon solvents such as alkane and cycloalkane e.g., pentane, hexane, heptane and cyclohexane, and aromatic solvents such as toluene, mesitylene, xylene and mesitylene. There can be used terpenes such as limonene, dipentene, pinene and menthane, and there can be suitably used organic solvents prepared by adding an appropriate amount of a surfactant to the terpenes.

As the method for development, a means such as spraying, paddle, immersion and ultrasonic wave or the like is usable. Then, the relief pattern formed by development is rinsed. As the rinsing liquid, alcohol is used. Then, a heat treatment is applied at 50 to 200° C. to remove the developing solution and the rinsing liquid, and the curing of the epoxy group is completed to obtain a final pattern having high heat resistance.

Next, the semiconductor device of the present invention will be explained referring to the accompanying drawings. FIG. 1 is an enlarged sectional view of a pad portion of a semiconductor device having a bump, of the present invention. As shown in FIG. 1, an Al pad 2 for input and output is formed on a silicon wafer 1; thereon is formed a passivation film 3; and a via hole is formed in the passivation film 3. Thereon is formed a polynorbornene resin film (a buffer coat film) 4. Furthermore, a metal (e.g. Cr or Ti) film 5 is formed so as to contact with the Al pad 2. The metal film 5 is removed by etching, in the vicinity of a solder bump 10 to secure insulation between pads. A barrier metal 8 and a solder bump 10 are formed for the insulated pad. Since the norbornene resin is excellent in low stress properties and the warpage of the wafer is small, the exposure and the conveyance of the wafer can be performed with high accuracy. Since the stress from the sealing resin can be eased also in mounting, the damage of a Low k layer can be prevented, and thereby the semiconductor device having high reliability can be provided.

EXAMPLES

The present invention is specifically described below by way of Examples.

Example 1

Synthesis of Polymer

This example illustrates a copolymer (A-1) of 5-decyl-2-norbornene (hereinafter, referred to as "decyl norbornene")/5-[(2,3-epoxypropoxy)methyl]-2-norbornene (hereinafter, referred to as "glycidyl methyl ether norbornene")=50/50.

All glasswares were dried at 60° C. under a 0.1 torr vacuum for 18 hours. The glasswares were then transferred into a glovebox and attached to the glovebox. After ethyl acetate (917 g), cyclohexane (917 g), decyl norbornene (137 g, 0.585 mol), and glycidyl methyl ether norbornene (105 g, 0.585 mol) were added into a reaction flask, the reaction flask was removed from the glovebox, and dry nitrogen gas was introduced into the reaction flask. The reaction medium was degassed by passing a stream of nitrogen gas through the solution for 30 minutes. Inside the glovebox, 9.36 g (19.5 mmol) of a nickel catalyst, i.e., bis(toluene)bis(perfluorophenyl) nickel, was dissolved in 15 ml of toluene, taken up in a 25 mL syringe, removed from the glovebox and added into the reaction flask. The reaction was completed by stirring the solution at 20° C. for 5 hours. Next, a peracetic acid solution (975 mmol) was added, and the solution was stirred for 18 hours. Stirring was stopped and water and solvent layers were allowed to separate. The water layer was removed and 1 liter of distilled water was added. The solution was stirred for 20 minutes. The water layer was permitted to separate and was removed. The wash with 1 liter of distilled water was performed a total of 3 times. Polymer was then precipitated by addition into methanol. After the solid polymer was recovered by filtration and sufficiently washed with water, the solid polymer was dried under vacuum. 222 g of dry polymer (94% conversion) was recovered after drying. Polymer molecular weight by GPC Mw=114,000 Mn=47,000, monodispersity (PDI)=2.42. Tg by DMA=180° C. Polymer composition by H-NMR 48 mole % decyl norbornene: 52 mole % epoxy norbornene.

Example 2

Synthesis of Polymer

This example illustrates a copolymer (A-2) of decyl norbornene/glycidyl methyl ether norbornene=70/30.

All glasswares were dried at 60° C. under a 0.1 torr vacuum for 18 hours. The glasswares were then transferred into a glovebox and attached to the glovebox. After ethyl acetate (917 g), cyclohexane (917 g), decyl norbornene (192 g, 0.82 mol), and glycidyl methyl ether norbornene (62 g, 0.35 mol) were added to a reaction flask, the reaction flask was removed from the glovebox, and dry nitrogen gas was introduced into the reaction flask. The reaction medium was degassed by passing a stream of nitrogen gas through the solution for 30 minutes. Inside the glovebox, 9.36 g (19.5 mmol) of a nickel catalyst, i.e., bis(toluene)bis(perfluorophenyl) nickel, was dissolved in 15 ml of toluene, taken up in a 25 mL syringe, removed from the glovebox and added into the reaction flask. The reaction was completed by stirring the solution at 20° C. for 5 hours. Next, a peracetic acid solution (975 mmol) was added, and the solution was stirred for 18 hours. Stirring was stopped and water and solvent layers were allowed to separate. The water layer was removed and 1 liter of distilled water was added. The solution was stirred for 20 minutes. The water layer was permitted to separate and was removed. The wash with 1 liter of distilled water was performed a total of 3 times. Polymer was then precipitated by addition into methanol. After the solid polymer was recovered by filtration and sufficiently washed with water, the solid polymer was dried under vacuum. 243 g of dry polymer (96% conversion) was recovered after drying. Polymer molecular weight by GPC Mw=115,366 Mn=47,000, monodispersity (PDI)=2.43. Polymer composition by H-NMR 70 mole % decyl norbornene: 30 mole % epoxy norbornene.

Example 3

Synthesis of Polymer

This example illustrates a copolymer (A-3) of decyl norbornene/glycidyl methyl ether norbornene=40/60.

All glasswares were dried at 60° C. under a 0.1 torr vacuum for 18 hours. The glasswares were then transferred into a glovebox and attached to the glovebox. After ethyl acetate (917 g), cyclohexane (917 g), decyl norbornene (29.43 g, 0.144 mol), and glycidyl methyl ether norbornene (16.6 g, 0.212 mol) were added to a reaction flask, the reaction flask was removed from the glovebox, and dry nitrogen gas was introduced into the reaction flask. The reaction medium was degassed by passing a stream of nitrogen gas through the solution for 30 minutes. Inside the glovebox, 1.59 g (3.63 mmol) of a nickel catalyst, i.e., bis(toluene)bis(perfluorophenyl) nickel, was dissolved in 7 ml of toluene, taken up in a 10 mL syringe, removed from the glovebox and added into the reaction flask. The reaction was completed by stirring the solution at 20° C. for 1 hour. Next, 180 g of ion-exchange resin Amberlite IRC-718 was added, and the solution was stirred for 5 hours. After the solution was filtered, polymer was then precipitated by addition into methanol. After the solid polymer was recovered by filtration and sufficiently washed with water, the solid polymer was dried under vacuum. 74 g of dry polymer (92.5% conversion) was recovered after drying. Polymer molecular weight by GPC Mw=164,941 Mn=59,454, monodispersity (PDI)=2.77.

Example 4

Production of Photosensitive Resin Composition

After 228 g of the resin synthesized in Example 1 was dissolved in 342 g of mesitylene, 4-methylphenyl-4-(1-methylethyl)phenyliodonium tetrakis(pentafluorophenyl)borate (0.2757 g, 2.71×10$^{-4}$ mol), 1-chloro-4-propoxy-9H-thioxanthone (0.826 g, 2.71×10$^{-4}$ mol), phenothiazine (0.054 g, 2.71×10$^{-4}$ mol), and 3,5-di-t-butyl-4-hydroxyhydrocinnamate (0.1378 g, 2.60×10$^{-4}$ mol) were added thereto, and dissolved. The resulting solution was filtered through a 0.2 µm fluoro-resin filter to obtain a photosensitive resin composition.

Example 5

Evaluation of Properties

The produced photosensitive resin composition was coated on a silicon wafer using a spin coater, followed by drying on a hot plate at 100° C. for 10 minutes to obtain a coating film having a thickness of about 10 µm. To this coating film was applied a light at 300 mJ/cm$^2$ through a reticle using an i-line stepper exposure, NSR-4425i (manufactured by Nikon Corporation). The coating film was then heated in order to promote the cross-linking reaction of a light-exposed portion at 115° C. for 15 minutes by the hot plate.

Then, the resulting material was immersed in limonene for 60 seconds to dissolve and remove a non-light-exposed portion, and rinsed with isopropyl alcohol for 20 seconds. As a result, the formation of a pattern could be observed. The residual film ratio (film thickness after development/film thickness before development) was very high at 99.6%. In the remaining pattern, detailed pattern peeling was not observed at all, and excellent adhesiveness during the development could be observed. The pattern was then cured at 200° C. for 60 minutes, and the cross-linking reaction was completed.

After a photosensitive resin composition was independently coated on a silicon wafer (thickness: 625 µm) of 6 inches similarly and prebaked, the photosensitive resin composition was cured by heating at 200° C. for 60 minutes. The measured warpage of the wafer was 28 µm. Also, the water absorption of this cured film was 0.2%.

The stress calculated from change of the curvature radius of the wafer before and after forming the photosensitive resin film was 7 MPa. The dielectric constant measured in accordance with JIS C 6481 was 2.5.

Figure 2:
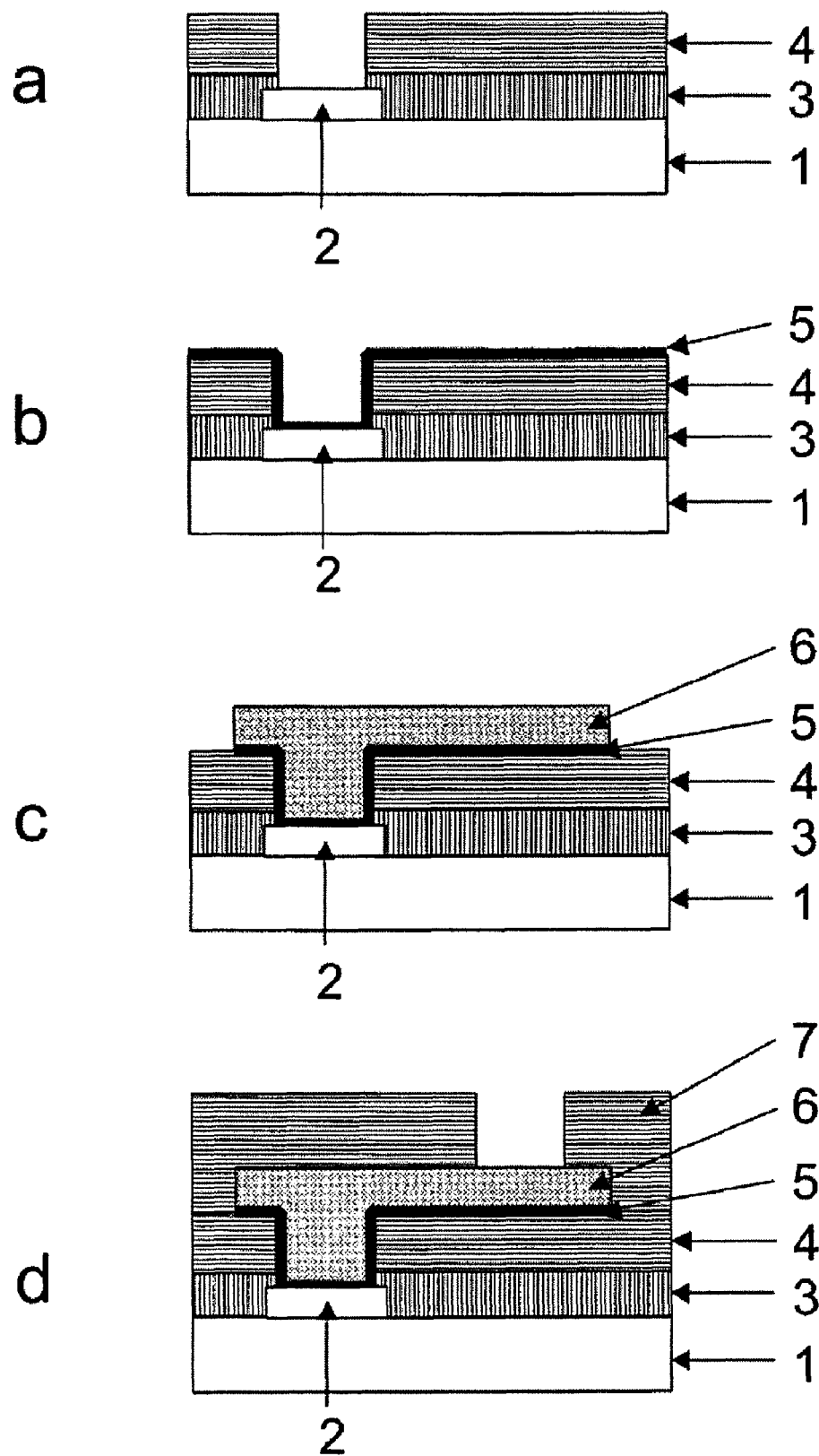
FIGS. 2A to 2D are sectional views showing production steps of an example of a semiconductor device of the present invention.
Figure 3:
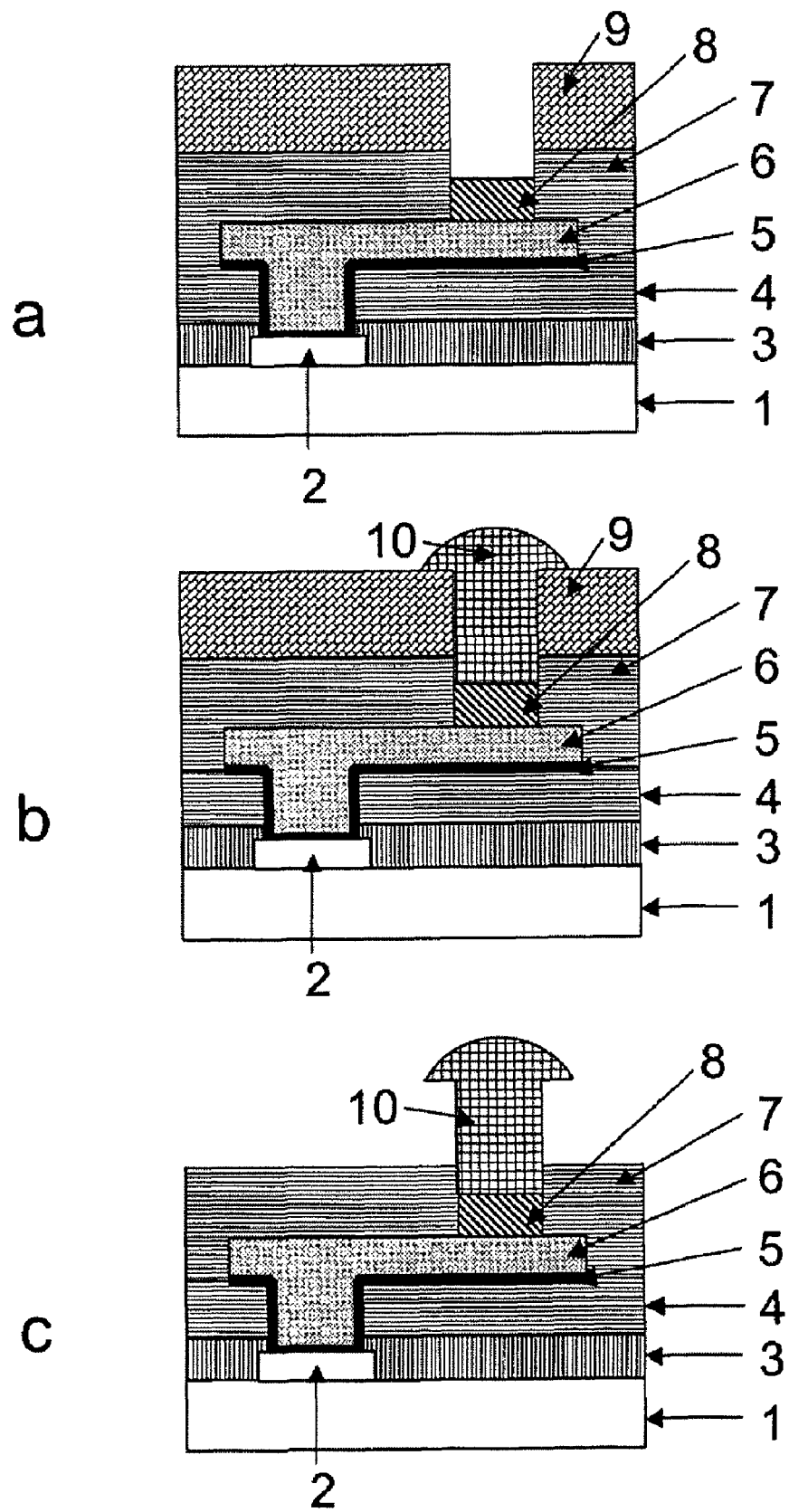
FIGS. 3A to 3C are sectional views showing production steps of an example of a semiconductor device of the present invention.
Figure 4:
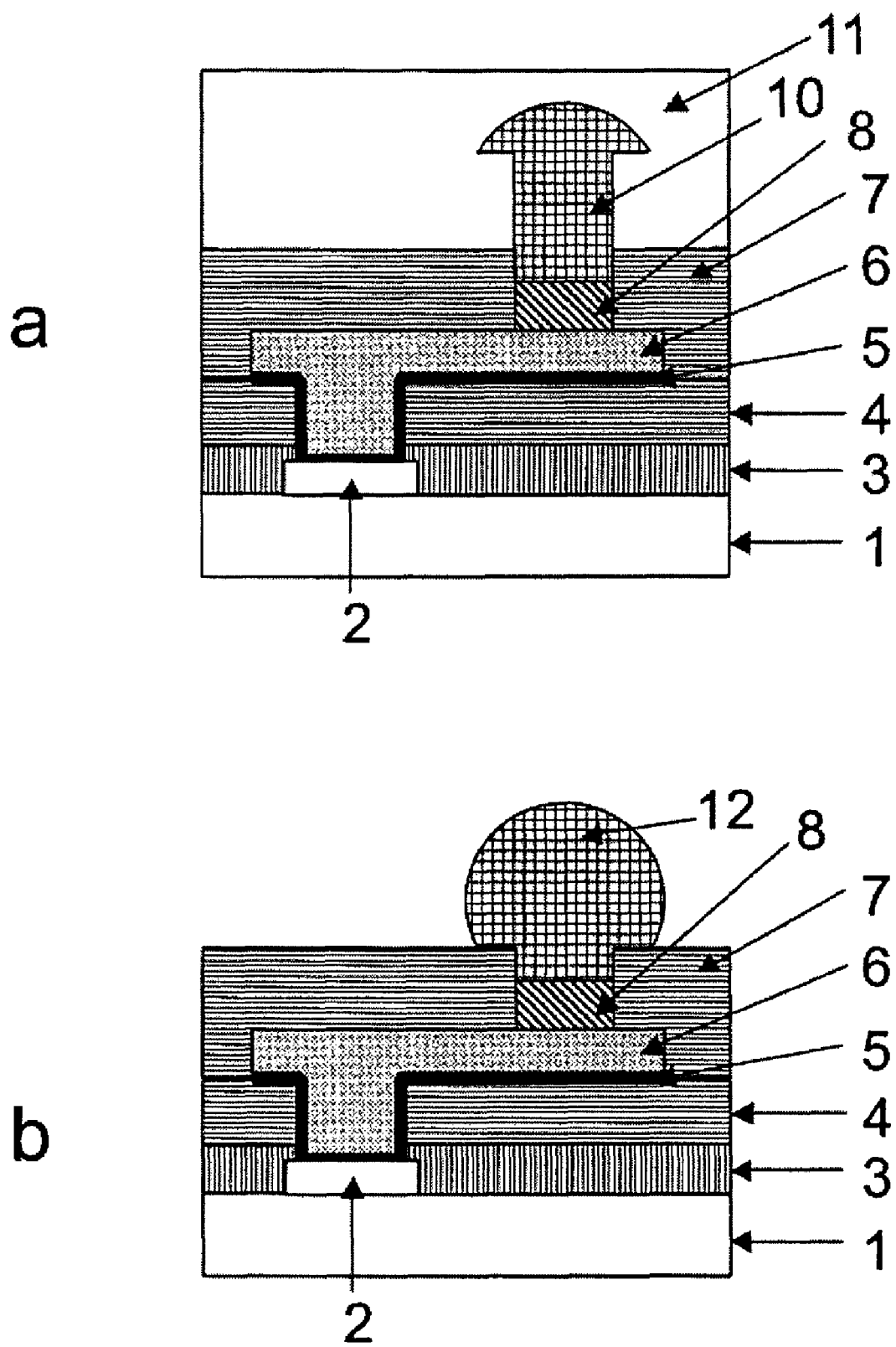
FIGS. 4A and 4B are sectional views showing production steps of an example of a semiconductor device of the present invention.

Next, the manufacturing method of the semiconductor device having the wafer level package structure of the present invention will be explained. Then, as shown in FIG. 2C, a wiring metal film was formed by plating. Then, as shown in FIG. 2D, the photosensitive resin composition was coated and a pattern (an insulating film) 7 was formed via photolithography. Then, as shown in FIG. 3B, a barrier metal 8 and a solder 10 were deposited in this order, by plating. Then, as shown in FIG. 4A, a flux 11 was coated and the solder 10 was melted by heating. Then, the flux 11 was removed by washing, to form a solder bump 12 as shown in FIG. 4B, and dicing was conducted along a scribing line to obtain individual chips.

Example 6

Preparation was made in the same manner as in Example 4 and evaluation was made in the same manner as in Example 5 except that the resin synthesized in Example 1 was replaced by 228 g of the resin synthesized in Example 2. The results are shown in Table 1.

Example 7

Preparation was made in the same manner as in Example 4 and evaluation was made in the same manner as in Example 5 except that the resin synthesized in Example 1 was replaced by 228 g of the resin synthesized in Example 3. The results are shown in Table 1.

Example 8

Evaluation was made in the same manner as in Example 6 except that the film thickness after coating was set to 20 µm in Example 6. The results are shown in Table 1.

Example 9

Evaluation was made in the same manner as in Example 6 except that the curing conditions were changed to 160° C. for 60 minutes in Example 6. The results are shown in Table 1.

Example 10

Evaluation was made in the same manner as in Example 6 except that the curing conditions were changed to 260° C. for 60 minutes in Example 6. The results are shown in Table 1.

Comparative Example 1

A flip chip similar to that of Example 1 was produced by using a non-photosensitive polyimide resin, CRC-6061 (manufactured by Sumitomo Bakelite Co., Ltd.). Coating was made, by using a spin coater, on a wafer wherein a via hole had been formed in a passivation film using a resist. Then, drying was conducted on a hot plate at 140° C. for 4 minutes to form a coating film having a thickness of about 10 μm. Thereon was coated a positive resist, OFPR-800 (manufactured by Tokyo Ohka Kogyo Co., Ltd.) by using a spin coater, followed by drying on a hot plate at 100° C. for 2 minutes to obtain a coating film having a thickness of about 2 μm. To this coating film was applied a light at 400 mJ/cm² through a reticle by using a g-line stepper exposure, NSR-1505G3A (manufactured by Nikon Corporation).

Then, the resulting material was immersed in a 2.38% aqueous tetramethylammonium hydroxide solution for 60 seconds to dissolve and remove the light-exposed portion, and was rinsed with pure water for 30 seconds.

Then, the resulting material was subjected to curing in a clean oven under nitrogen atmosphere at 150° C. for 30 minutes and at 350° C. for 30 minutes. The water absorption of the cured film was 1.5%. Thus, the cured film has a high water absorption of 1.5% and is inferior in reliability.

After a photosensitive resin composition was independently coated on a silicon wafer (thickness: 625 μm) of 6 inches similarly and prebaked, the photosensitive resin composition was cured by heating at 350° C. for 30 minutes. The measured warpage of the wafer was 35 μm. The dielectric constant of this cured film was 3.5.

Comparative Example 2

Evaluation was made in the same manner as in Example 1 except that the curing conditions were changed to 150° C. for 30 minutes and 280° C. for 30 minutes under nitrogen atmosphere in Example 1. Since the ring closure reaction was insufficient at 280° C., cracks appeared in the buffer coat film after the formation of a bump.

The results of measurements in Examples and Comparative Examples are shown in Table 1.

[Table 1]

TABLE 1

| | Polynor-bornene | Film Thickness (μm) | Curing Condition (° C./min) | Elastic Modulus (GPa) | Dielectric Constant (%) | Stress (MPa) |
|---|---|---|---|---|---|---|
| Ex. 5 | A-1 | 10 | 200/60 | 0.60 | 2.5 | 7 |
| Ex. 6 | A-2 | 10 | 200/60 | 0.45 | 2.5 | 5 |
| Ex. 7 | A-3 | 10 | 200/60 | 0.80 | 2.6 | 9 |
| Ex. 8 | A-2 | 20 | 200/60 | 0.45 | 2.5 | 5 |
| Ex. 9 | A-2 | 10 | 160/60 | 0.45 | 2.5 | 5 |
| Com. Ex. 1 | CRC-6061 | 10 | 350/30 | 3.00 | 3.5 | 35 |
| Com. Ex. 2 | CRC-6061 | 10 | 280/30 | 2.80 | 3.8 | 30 |

INDUSTRIAL APPLICABILITY

The present invention is used suitably for a resin-sealed semiconductor device having a lead on chip structure which is excellent in low stress properties, solvent resistance, low water absorbency, electric insulation properties and adhesiveness or the like.

The invention claimed is:

1. A semiconductor device having a wafer level package structure comprising a resin composition containing a cyclic olefin resin (A) having an epoxy group and a photoacid generator (B), wherein the resin layer has an elastic modulus after curing of 0.1 GPa or more but no more than 2.0 GPa;
    wherein the cyclic olefin resin (A) having an epoxy group contains repeating units represented by the formulae (4), (5) and (6):

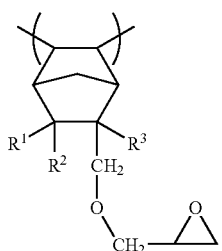

(4)

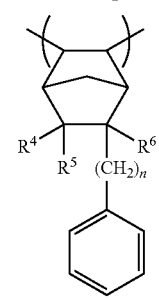

(5)

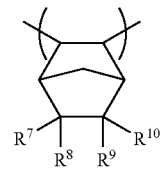

(6)

wherein n is an integer of 0 to 5; $R^1$ to $R^{10}$ are each independently selected from a hydrogen atom, an alkyl group, an alkenyl group, an alkynyl group, an aryl group, an aralkyl group, a functional group containing an ester group, a functional group containing a ketone group, and a functional group containing an ether group; and $R^1$ to $R^{10}$ may be different in a repetition of a monomer.

2. A semiconductor device having a wafer level package structure comprising a resin composition containing a cyclic olefin resin (A) having an epoxy group and a photoacid generator (B), wherein the resin layer has an elastic modulus after curing of 0.1 GPa or more but no more than 2.0 GPa;
    wherein the cyclic olefin resin (A) having an epoxy group contains a repeating unit represented by the formula (1):

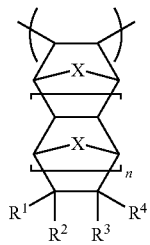

(1)

wherein X is O, CH, or $(CH_2)_2$; n is an integer of 0 to 5; $R^1$ to $R^4$ are each independently selected from a hydrogen atom, an alkyl group, an alkenyl group, an alkynyl group, an aryl group, an aralkyl group, a functional group containing an ester group, a functional group containing a ketone group, a functional group containing an ether group, and a functional group containing an epoxy group; $R^1$ to $R^4$ may be different in a repetition of a monomer; and at least one of $R^1$ to $R^4$ in all the repeating units is the functional group having an epoxy group, wherein the cyclic olefin resin (A) having an epoxy group further contains a repeating unit represented by the formula (7):

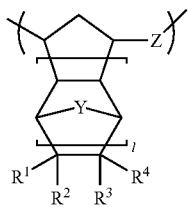

(7)

wherein Y is O, $CH_2$ or $(CH_2)_2$; Z is $—CH_2—CH_2—$ or $—CH=CH—$; l is an integer of 0 to 5; $R^1$ to $R^4$ are each independently selected from a hydrogen atom, an alkyl group, an alkenyl group, an alkynyl group, an aryl group, an aralkyl group, a functional group containing an ester group, a functional group containing a ketone group, a functional group containing an ether group, and a functional group containing an epoxy group; $R^1$ to $R^4$ may be different in a repetition of a monomer; and at least one of $R^1$ to $R^4$ in all the repeating units has the epoxy group.

3. A semiconductor device according to claim 1 or 2, having a wafer level package structure comprising a resin layer having a dielectric constant of 2.6 or less.

4. A semiconductor device according to claim 1 or 2, having a wafer level package structure comprising a resin layer having a resin composition which is curable at 250° C. or less.

* * * * *